(12) United States Patent
Fujii et al.

(10) Patent No.: US 12,171,112 B2
(45) Date of Patent: Dec. 17, 2024

(54) DISPLAY DEVICE AND ELECTRONIC APPARATUS

(71) Applicant: SONY SEMICONDUCTOR SOLUTIONS CORPORATION, Kanagawa (JP)

(72) Inventors: Takuma Fujii, Kanagawa (JP); Yosuke Motoyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 645 days.

(21) Appl. No.: 17/431,836

(22) PCT Filed: Feb. 18, 2020

(86) PCT No.: PCT/JP2020/006230
§ 371 (c)(1),
(2) Date: Aug. 18, 2021

(87) PCT Pub. No.: WO2020/175235
PCT Pub. Date: Sep. 3, 2020

(65) Prior Publication Data
US 2022/0140281 A1 May 5, 2022

(30) Foreign Application Priority Data

Feb. 28, 2019 (JP) ................. 2019-035617

(51) Int. Cl.
*H10K 50/842* (2023.01)
*G02B 5/20* (2006.01)
(Continued)

(52) U.S. Cl.
CPC ....... *H10K 50/8426* (2023.02); *H10K 50/818* (2023.02); *H10K 59/38* (2023.02)

(58) Field of Classification Search
CPC .. H10K 50/8426; H10K 50/841; H10K 59/38; H10K 59/871; H10K 59/8722; G02B 5/201
See application file for complete search history.

(56) References Cited

U.S. PATENT DOCUMENTS

2014/0042408 A1* 2/2014 Akagawa ............... H10K 71/00
257/40
2015/0102376 A1 4/2015 Toya et al.
2017/0005144 A1 1/2017 Akagawa et al.

FOREIGN PATENT DOCUMENTS

CN 1658713 A 8/2005
CN 104582053 A 4/2015
(Continued)

OTHER PUBLICATIONS

International Search Report and Written Opinion of PCT Application No. PCT/JP2020/006230, issued on Apr. 7, 2020, 10 pages of ISRWO.

*Primary Examiner* — Antonio B Crite
(74) *Attorney, Agent, or Firm* — CHIP LAW GROUP

(57) ABSTRACT

A display device according to an embodiment of the present technology includes a transparent substrate, an element substrate, a color filter layer, a metal electrode layer, and a transparent adhesive layer. The element substrate includes an opposing surface facing the transparent substrate, and an organic EL element that emits light from a display region of the opposing surface. The color filter layer is disposed on the opposing surface to avoid a bonding region provided in a peripheral region surrounding the display region of the opposing surface. The metal electrode layer is disposed on the element substrate to avoid at least a part of an overlapping region that overlaps with the bonding region when viewed from the transparent substrate. The transparent adhe- (Continued)

sive layer bonds the transparent substrate and the element substrate to each other via the bonding region.

17 Claims, 9 Drawing Sheets

(51) Int. Cl.
*H10K 50/818* (2023.01)
*H10K 59/38* (2023.01)
*H10K 59/80* (2023.01)

(56) References Cited

FOREIGN PATENT DOCUMENTS

| | | | |
|---|---|---|---|
| CN | 106057848 | A | 10/2016 |
| CN | 106328674 | A | 1/2017 |
| CN | 106356467 | A | 1/2017 |
| JP | 2006-338946 | A | 12/2006 |
| JP | 2010097192 | A | 4/2010 |
| JP | 2015-076297 | A | 4/2015 |
| JP | 2016-066470 | A | 4/2016 |
| JP | 2017-016822 | A | 1/2017 |
| TW | 201515216 | A | 4/2015 |
| TW | 201907562 | A | 2/2019 |

* cited by examiner

DISPLAY DEVICE AND ELECTRONIC APPARATUS

CROSS REFERENCE TO RELATED APPLICATIONS

This application is a U.S. National Phase of International Patent Application No. PCT/JP2020/006230 filed on Feb. 18, 2020, which claims priority benefit of Japanese Patent Application No. JP 2019-035617 filed in the Japan Patent Office on Feb. 28, 2019. Each of the above-referenced applications is hereby incorporated herein by reference in its entirety.

TECHNICAL FIELD

The present technology relates to a display device and an electronic apparatus that display images.

BACKGROUND ART

In the past, a display device in which color filters are disposed on organic electroluminescent (EL) elements has been developed. For example, providing the color filters allows light control of display colors, improvement in the characteristics of a viewing angle, or shielding of surrounding wiring from light.

Patent Literature 1 discloses an organic electroluminescent device including color filters. In this device, a first color filter is formed in a display region where an organic electroluminescent element is formed, and a second color filter is formed in a non-display region where wiring or the like outside the display region is formed. A counter substrate is bonded to each color filter through a transparent adhesive layer. Further, a gap is provided between the first and second color filters. This makes it possible to prevent the first color filter from being peeled off due to the separation process at the time of manufacturing (paragraphs [0064], [0084], [0087], and [0118] of the specification, FIGS. 7 and 8, and the like of Patent Literature 1).

CITATION LIST

Patent Literature

Patent Literature 1: Japanese Patent Application Laid-open No. 2016-66470

DISCLOSURE OF INVENTION

Technical Problem

Recently, there have been increasing opportunities for display devices using organic EL elements to be mounted on imaging devices, mobile terminals, or the like, and the technology capable of achieving high-quality image display as well as improving reliability of the devices has been expected.

In view of the above circumstances, it is an object of the present technology to provide a display device and an electronic apparatus that are capable of achieving high-quality image display as well as improving the reliability of the device and the apparatus.

Solution to Problem

In order to achieve the object described above, a display device according to an embodiment of the present technology includes a transparent substrate, an element substrate, a color filter layer, a metal electrode layer, and a transparent adhesive layer.

The element substrate includes an opposing surface facing the transparent substrate, and an organic EL element that emits light from a display region of the opposing surface.

The color filter layer is disposed on the opposing surface to avoid a bonding region provided in a peripheral region surrounding the display region of the opposing surface.

The metal electrode layer is disposed on the element substrate to avoid at least a part of an overlapping region that overlaps with the bonding region when viewed from the transparent substrate.

The transparent adhesive layer bonds the transparent substrate and the element substrate to each other via the bonding region.

In this display device, the opposing surface of the element substrate including the organic EL element is directed to the transparent substrate. The color filter layer is disposed on the opposing surface while avoiding the bonding region provided in the peripheral region surrounding the display region. Further, the metal electrode layer is disposed on the element substrate while avoiding at least a part of the overlapping region that overlaps with the bonding region when viewed from the transparent substrate. The transparent substrate and the element substrate are bonded to each other by the transparent adhesive layer via the bonding region. As a result, the bonding performance of each substrate is improved and reflection of the metal electrode layer is suppressed, so that it is possible to improve the reliability of the device and also to achieve high-quality image display.

The color filter layer may include a first color filter disposed in the display region, and a second color filter disposed in the peripheral region to avoid the bonding region.

The first color filter may be a colored filter that colors the light of the organic EL element. In this case, the second color filter may be a light shielding filter that shields the metal electrode layer from light.

The bonding region may be provided in at least a part of a periphery of the display region.

The bonding region may include one or more belt-like regions surrounding the display region.

The bonding region may be provided at an outer edge of the peripheral region.

The metal electrode layer may include a metal reflective film that reflects the light of the organic EL element, and a peripheral electrode disposed to avoid at least a part of the overlapping region.

The organic EL element may include a transparent common electrode disposed on the opposing surface side of the element substrate. In this case, the peripheral electrode may be electrically connected to the common electrode.

The common electrode may be disposed on the peripheral electrode.

The peripheral electrode may include a plurality of partial electrodes spaced apart from each other. In this case, the common electrode may be disposed on the plurality of partial electrodes.

The organic EL element may include a pixel electrode disposed on a side of the common electrode opposite to the opposing surface, and an organic light emitting layer disposed between the common electrode and the pixel electrode. In this case, the metal reflective film may reflect light generated in the organic light emitting layer to the opposing surface.

The metal reflective film may be the pixel electrode.

The element substrate may include a protective film formed to cover the common electrode. In this case, the opposing surface may be a surface of the protective film that faces the transparent substrate.

Display device.

The peripheral electrode may be a metal film closest to the color filter layer.

The transparent adhesive layer may be a sealant applied to surround the display region.

The transparent adhesive layer may be a filler provided between the transparent substrate and the element substrate.

An electronic apparatus according to an embodiment of the present technology includes a display device and a drive circuit.

The display device includes a transparent substrate, an element substrate including an opposing surface facing the transparent substrate and an organic EL element that emits light from a display region of the opposing surface, a color filter layer disposed on the opposing surface to avoid a bonding region provided in a peripheral region surrounding the display region of the opposing surface, a metal electrode layer disposed on the element substrate to avoid at least a part of an overlapping region that overlaps with the bonding region when viewed from the transparent substrate, and a transparent adhesive layer that bonds the transparent substrate and the element substrate to each other via the bonding region.

The drive circuit drives the display device.

MODE(S) FOR CARRYING OUT THE INVENTION

Embodiments according to the present technology will now be described below with reference to the drawings.

First Embodiment

[Configuration of Display Device]

Figure 1:
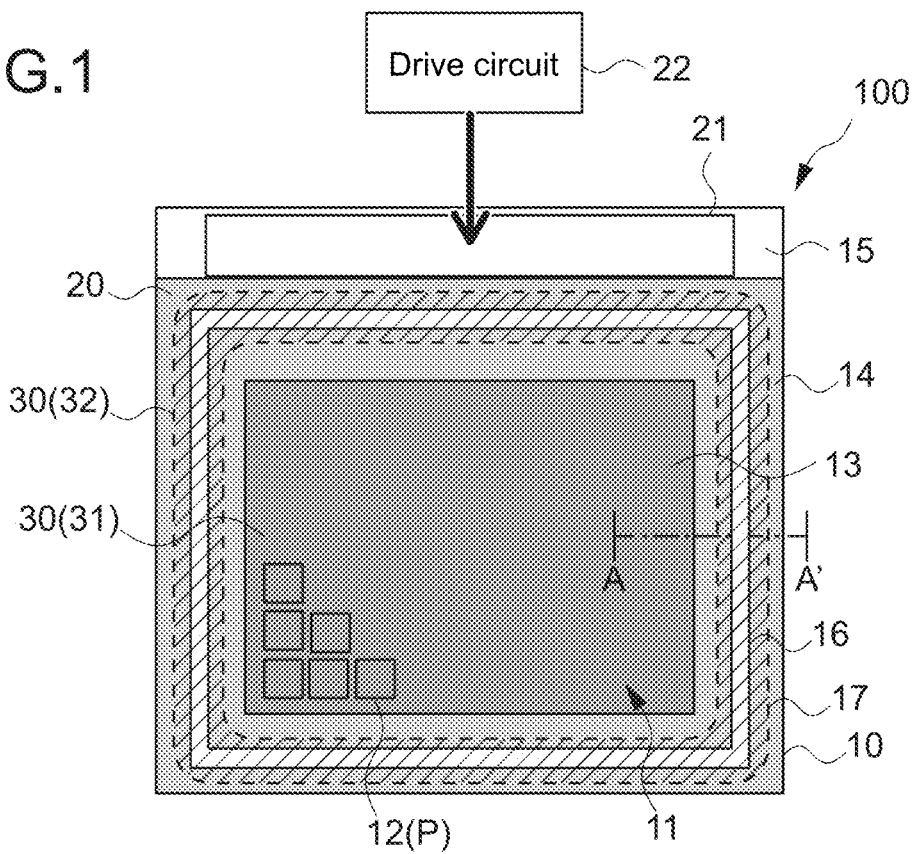
FIG. 1 is a schematic diagram showing a configuration example of a display device according to a first embodiment.

FIG. 1 is a schematic diagram showing a configuration example of a display device 100 according to a first embodiment. The display device 100 is an organic EL display for displaying an image by driving an organic EL element.

The display device 100 is configured as a display module, for example, and is mounted on various electronic apparatuses as a viewfinder of a video camera, a digital camera, or the like, and as a display of a smartphone, a tablet, or the like (see FIGS. 11A, 11B, 12A, 12B, 13, and 14, etc.). The type or the like of the electronic apparatus in which the display device 100 is used is not limited. For example, the present technology is also applicable when the display device 100 is used as a monitor for a television or PC.

FIG. 1 schematically shows a plan view of the display device 100 when viewed from the side where the image is displayed, i.e., the side where the light of the organic EL element is emitted. The display device 100 includes an element substrate 10 and a transparent substrate 20 disposed on the element substrate 10. In the display device 100, an image is displayed through the transparent substrate 20.

The element substrate 10 includes an opposing surface 11 that faces the transparent substrate 20, and a plurality of organic EL elements 12. The plurality of organic EL elements 12 constitutes a plurality of pixels P constituting an image. In FIG. 1, the square-shaped pixel P is schematically illustrated. The number of pixels, the pixel size, or the like in the display device 100 is not limited, and may be appropriately set so as to obtain desired resolution or the like.

The opposing surface 11 includes a display region 13, a peripheral region 14, and an external region 15. The display region 13 is a rectangular region in which the plurality of pixels P is arranged, and is a region in which an image is actually displayed. In this embodiment, light is emitted by the organic EL elements 12 from the display region 13 of the opposing surface 11, and an image is displayed. It can be said that the display region 13 is an effective pixel area where the pixels P contributing to actual image display are disposed.

The peripheral region 14 is a region surrounding the display region 13. That is, the peripheral region 14 is a region surrounding an image displayed on the display device 100. For example, the width of the bezel (frame portion) of the display device 100 is determined by the width of the peripheral region 14. In the example shown in FIG. 1, the peripheral region 14 is a region of the opposing surface 11 except for the display region 13 and the external region 15 disposed outside the display region 13 and separated from the display region 13. The peripheral region 14 includes, for example, various types of wiring, circuits, and the like (not shown) for driving the organic EL elements 12.

Further, a bonding region 16 is provided in the peripheral region 14. The bonding region 16 is, for example, a region for bonding the transparent substrate 20 and the element substrate 10 to each other, and is provided at least partially around the display region 13. As will be described later, a color filter layer 30 is disposed on the opposing surface 11. The color filter layer 30 is disposed in the display region 13 and a region outside the bonding region 16 in the peripheral region 14. Therefore, the bonding region 16 is a region where the color filter layer 30 is not disposed and the opposing surface 11 is exposed.

In FIG. 1, the color filter layer 30 (first color filter 31) disposed in the display region 13 is illustrated as a dark gray region, and the color filter layer 30 (second color filter 32) disposed in the peripheral region 14 is illustrated as a light gray region. Further, a white region in the peripheral region 14 serves as the bonding region 16. A sealant (see FIG. 4) for bonding the transparent substrate 20 and the element substrate 10 to each other is applied to an application region 17 (hatched region in the drawing) including the bonding region 16. This will be described later in detail.

The external region 15 is provided on the outside of the peripheral region 14 of the opposing surface 11, and is a region where the transparent substrate 20 is not disposed and the element substrate 10 (opposing surface 11) is exposed (upper side in the drawing). An external electrode 21 is provided in the external region 15. A drive circuit 22 that drives the display device 100 is connected to the external electrode 21 via a flexible board or the like. The drive circuit 22 is mounted on an electronic apparatus main body and supplies power, image signals, and the like for driving the organic EL elements 12 to the display device 100. The type or the like of the drive circuit 22 or a drive signal is not limited.

The transparent substrate 20 is disposed to face the opposing surface 11 of the element substrate 10 so as to cover the display region 13 and the peripheral region 14. The transparent substrate 20 is a substrate that protects the organic EL elements 12 or the like formed on the element substrate 10. As the transparent substrate 20, for example, any substrate having transparency such as a glass substrate, an $SiO_2$ substrate, or an acrylic substrate may be used.

Figure 2:
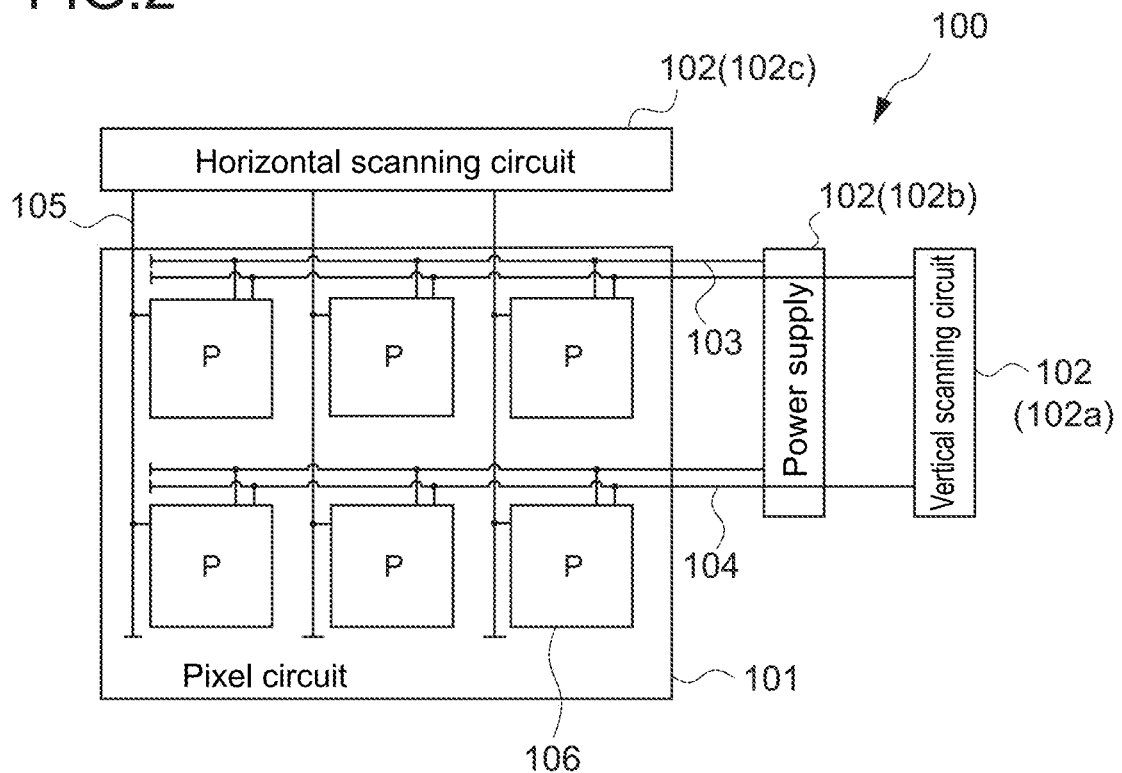
FIG. 2 is a block diagram showing an overall configuration example of the display device.

Here, the circuit configuration of the display device 100 will be described. FIG. 2 is a block diagram showing an overall configuration example of the display device 100. The display device 100 includes a pixel array 101 including the plurality of pixels P, and a drive unit 102 that drives the pixel array 101. The pixel array 101 is provided on the element substrate 10 so as to overlap with the display region 13 shown in FIG. 1. The drive unit 102 is provided on the element substrate 10 so as to overlap with the peripheral region 14.

The pixel array 101 includes the plurality of pixels P arranged in a matrix, and a power supply line 103 arranged to correspond to each row of the plurality of pixels P. Each pixel P includes a pixel circuit 106 disposed at a portion where a row-like scanning line 104 and a column-like signal line 105 intersect with each other.

The drive unit 102 includes a vertical scanning circuit 102a, a power supply 102b, and a horizontal scanning circuit 102c. The vertical scanning circuit 102a sequentially supplies a control signal to each scanning line 104 to sequentially scan each pixel P in units of rows. The power supply 102b supplies a constant power supply potential to each power supply line 103 to drive the pixel circuit 106 constituting the pixel P. When the power supply potential is made constant, it is possible to simplify the configuration of the power supply 102b, and to make the element size compact. The horizontal scanning circuit 102c supplies a signal potential serving as an image signal (video signal) and a reference potential to each signal line 105 in accordance with scanning by the vertical scanning circuit 102a.

In addition, the specific configuration of the drive unit 102 is not limited. For example, as the power supply 102b, a power supply scanner or the like may be used, which supplies a power supply potential at which a high potential and a low potential are switched to each other to each power supply line 103 in accordance with scanning by the vertical scanning circuit 102a. Thus, for example, even when the display device 100 is mounted on a medium-sized electronic apparatus (such as a smartphone) or a large-sized electronic apparatus (such as a television or a PC monitor), it is possible to stably drive the display device 100 while suppressing power consumption.

Figure 3:
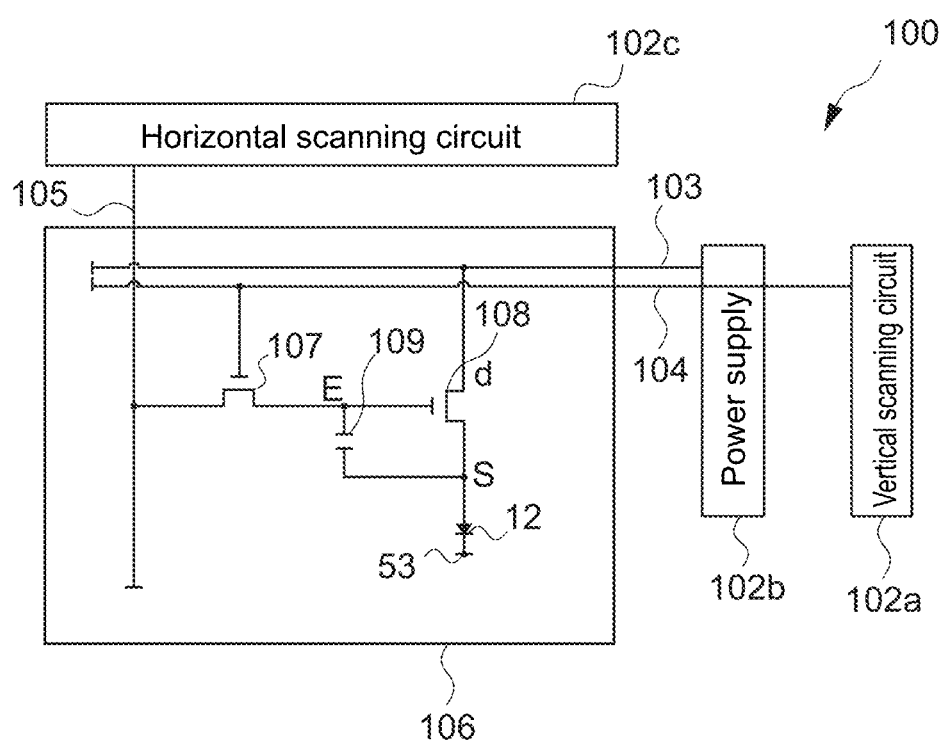
FIG. 3 is a circuit diagram showing a specific configuration example of a pixel circuit shown in FIG. 2.

FIG. 3 is a circuit diagram showing a specific configuration example of the pixel circuit 106 shown in FIG. 2. The pixel circuit 106 includes a diode that functions as the organic EL element 12, a sampling transistor 107, a driving transistor 108, and a holding capacitor 109.

A control terminal (gate) of the sampling transistor 107 is connected to the scanning line 104, one of the drive terminals (source and drain) is connected to the signal line 105, and the other one is connected to a control terminal of the driving transistor 108. One of the drive terminals of the driving transistor 108 is connected to the anode of the organic EL element 12, and the other one is connected to the power supply line 103. Further, the cathode of the organic EL element 12 is connected to a common electrode common to the plurality of organic EL elements 12 (see FIG. 4). The holding capacitor 109 is connected between the control terminal of the driving transistor 108 and the anode of the organic EL element 12, and holds the signal potential of the image signal supplied from the signal line 105.

Figure 4:
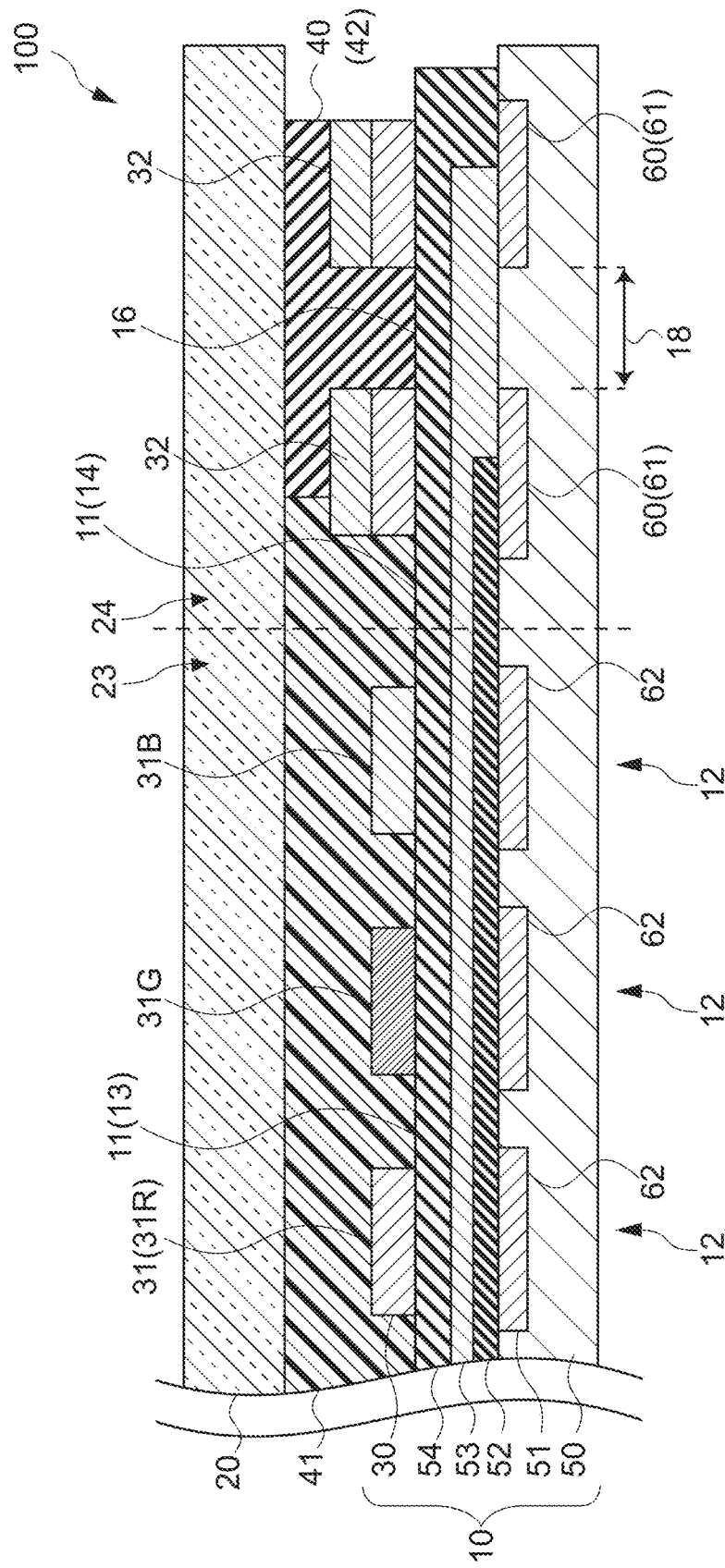
FIG. 4 is a schematic diagram showing an example of a cross-sectional structure of the display device.

FIG. 4 is a schematic view showing an example of a cross-sectional structure of the display device 100. FIG. 4 schematically shows a schematic cross-sectional structure of the display device 100 taken along the line AA' shown in FIG. 1. Hereinafter, a portion corresponding to the display region 13 of the display device 100 may be referred to as a display portion 23, and a portion corresponding to the peripheral region 14 may be referred to as a peripheral portion 24. The dotted line in the drawing is a line representing the boundary between the display region 13 and the peripheral region 14. The left side of the dotted line corresponds to the cross-sectional structure in the display portion 23 (display region 13), and the right side of the dotted line corresponds to the cross-sectional structure in the peripheral portion 24 (peripheral region 14).

As shown in FIG. 4, the display device 100 includes the element substrate 10 and the transparent substrate 20 as described above. Further, the display device 100 includes the color filter layer 30, a transparent adhesive layer 40, and a filler 41.

The element substrate 10 includes a circuit layer 50, a metal electrode layer 51, an organic light emitting layer 52, a common electrode 53, and a protective film 54. In this embodiment, the surface of the protective film 54 facing the transparent substrate 20 serves as the opposing surface 11. Therefore, the display region 13, the peripheral region 14, and the bonding region 16 described above are regions on the protective film 54.

The circuit layer 50 is configured by stacking a circuit for driving the organic EL elements 12 on the substrate. As the substrate, for example, a semiconductor substrate formed of Si or the like, a glass substrate, an acrylic substrate, or the like is used. Alternatively, a metal substrate formed of stainless steel or the like, a plastic film, or the like may be used as the substrate.

For example, a circuit including elements constituting the pixel circuit 106 shown in FIG. 3 (sampling transistor 107, driving transistor 108, holding capacitor 109, etc.) is stacked in the circuit layer 50. Further, the circuit layer 50 includes various types of wiring connected to the organic EL elements 12 (power supply line 103, scanning line 104, signal line 105, etc.). The specific configuration of the circuit layer 50 is not limited. A circuit for driving the organic EL elements 12, or the like may be appropriately stacked.

The metal electrode layer 51 is a layer constituting an electrode formed of a metal film. In this embodiment, the circuit layer 50 and the metal electrode layer 51 constitute the element substrate 10 of the display device 100. The metal electrode layer 51 is formed, for example, as one wiring layer in the circuit layer 50.

The metal electrode layer 51 is disposed in the element substrate 10 so as to avoid at least a part of an overlapping region 18 overlapping with the bonding region 16 when viewed from the transparent substrate 20. Here, the overlapping region 18 is a region in the element substrate 10 (circuit layer 50), which overlaps with the bonding region 16 when viewed from the normal direction of the transparent substrate 20, for example. In this embodiment, the metal electrode layer 51 is stacked on the uppermost layer of the circuit layer 50.

The metal electrode layer 51 includes a peripheral electrode 60 disposed so as to avoid at least a part of the overlapping region 18. The peripheral electrode 60 is an electrode disposed in the peripheral portion 24 of the lower layer of the peripheral region 14. In this embodiment, the peripheral electrode 60 (metal electrode layer 51) is disposed so as to avoid the overlapping region 18. Therefore, the metal film or the like constituting the peripheral electrode 60 is not disposed directly under the bonding region 16. Further, the peripheral electrode 60 (metal electrode layer 51) is disposed on the uppermost layer of the circuit layer 50, and is thus the metal film closest to the color filter layer 30.

The peripheral electrode 60 is electrically connected to the common electrode 53 to be described later. For example, as shown in FIG. 3, the common electrode 53 is a cathode electrode of the organic EL element 12 and is connected to a predetermined reference potential (typically, GND potential). Thus, the peripheral electrode 60 is an electrode electrically connected to the common electrode 53 to supply a reference potential. For example, reducing the contact resistance between the common electrode 53 and the peripheral electrode 60 makes it possible to supply the reference potential.

As shown in FIG. 4, the peripheral electrode 60 includes a plurality of partial electrodes 61 spaced apart from each other. Specifically, the peripheral electrode 60 is constituted by two partial electrodes 61 disposed with the overlapping region 18 interposed therebetween. Each partial electrode 61 is connected to the reference potential via wiring (not shown) provided in the circuit layer 50, for example. Alternatively, each partial electrode 61 may be short-circuited by wiring in the circuit layer 50. As a result, the contact area with the common electrode 53 can be increased, and the contact resistance can be lowered.

Further, the metal electrode layer 51 includes pixel electrodes 62 disposed in the display portion 23. The pixel electrodes 62 are the anode electrodes of the respective organic EL elements 12 and are disposed to correspond to the plurality of pixels P. In FIG. 4, three pixel electrodes 62 corresponding to the three pixels P are schematically illustrated. Each pixel electrode 62 is appropriately connected to the wiring of the pixel circuit 106 formed in the circuit layer 50.

In this embodiment, the pixel electrode 62 is a reflective electrode and functions as a metal reflective film for reflecting light of the organic EL element 12. In other words, the metal reflective film constitutes the pixel electrode 62. As will be described later, the organic light emitting layer 52 is stacked on the pixel electrode 62. Therefore, the pixel electrode 62 reflects the light generated by the organic light emitting layer 52 to the opposing surface 11. This makes it possible to reflect light traveling toward the circuit layer 50 and emit the light from the opposing surface 11, for example, and to sufficiently improve the luminous efficiency of the organic EL element 12.

In such a manner, the metal electrode layer 51 is stacked such that the pixel electrode 62 functions as the metal reflective film. Therefore, the peripheral electrode 60 constituted by the metal electrode layer 51 also becomes a metal reflective film having reflectance similar to that of the pixel electrode 62.

As a metal material constituting the metal electrode layer 51, a metal having light reflectivity such as aluminum (Al) or silver (Ag) is used. Alternatively, an alloy of a metal having light reflectivity, or the like may be used. For example, the light reflectance of the metal electrode layer 51 is set to, for example, 40% or more, and more preferably 80% or more. Thus, it is possible to sufficiently enhance the luminous efficiency of the organic EL element 12. In addition, the material, reflectance, or the like of the metal electrode layer 51 is not limited.

The organic light emitting layer 52 is a layer that emits light by recombination of the holes supplied from the anode electrode (pixel electrode 62) and the electrons supplied from the cathode electrode (common electrode 53). The organic light emitting layer 52 is configured to emit white light, for example.

In the organic light emitting layer 52, for example, a hole injection layer, a hole transport layer, a light emitting layer, an electron transport layer, and an electron injection layer are stacked in this order from the pixel electrode 62. The light emitting layer has a structure in which, for example, light emitting layers corresponding to R, G, and B of a red light emitting layer, a blue light emitting layer, and a green light emitting layer are stacked. As a result, the light emitting layer emits white light.

The hole injection layer (electron injection layer) is a buffer layer that enhances the efficiency of injecting holes (efficiency of injecting electrons) to the light emitting layer and prevents leakage. The hole transport layer (electron transport layer) is provided to enhance the efficiency of transporting holes (efficiency of transporting electrons) to the light emitting layer. The hole injection layer, the hole transport layer, the electron injection layer, and the electron transport layer can be formed of various materials generally used.

In the light emitting layer, light having a predetermined wavelength is emitted according to the material of the light emitting layer by recombination of electrons and holes. Examples of the material constituting the light emitting layer include polyfluorene-based polymer derivatives, (poly)paraphenylene vinylene derivatives, polyphenylene derivatives, polyvinylcarbazole derivatives, polythiophene derivatives, perylene-based dyes, coumarin-based dyes, rhodamine-based dyes, or a material obtained by doping an organic EL material into these polymers. Note that the light emitting layer may also serve as the above-mentioned hole transport layer or electron transport layer.

The organic light emitting layer 52 is formed on the circuit layer 50 by, for example, a vacuum vapor deposition method so as to cover each pixel electrode 62. The specific configuration of the organic light emitting layer 52 is not limited. For example, the material of each layer may be appropriately selected such that light having a desired wavelength can be emitted.

The common electrode 53 is a transparent electrode on which the organic light emitting layer 52 is stacked. As shown in FIG. 4, the common electrode 53 is disposed so as to cover the entire surface of the display portion 23. Also in the peripheral portion 24, the common electrode 53 is disposed on the peripheral electrode 60. Specifically, the common electrode 53 is disposed on the two partial electrodes 61. As a result, the common electrode 53 and the two partial electrodes 61 are electrically connected to each other, and the reference potential (GND potential) is supplied to the common electrode 53.

The common electrode 53 is formed of a transparent conductive film having good light transmittivity and low reflectance. For example, when a transparent conductive film is formed using an oxide, it is possible to constitute a common electrode 53 having good light extraction efficiency. In this case, ZnO, ITO, IZnO, InSnZnO, or the like is used as the common electrode 53.

The common electrode 53 may be formed of a single layer or may be formed by stacking a plurality of films having different functions. For example, the common electrode 53 may be formed by stacking a light-transmitting film having low reflectance and high transmittivity, a transparent conductive film having high conductivity, a deterioration preventing film that prevents corrosion of the electrode, and the like in this order from the organic light emitting layer 52. Thus, the common electrode 53 having high light transmission efficiency and corrosion resistance is provided. The common electrode 53 is formed by, for example, a deposition method such as a vacuum vapor deposition method, a sputtering method, or a plasma chemical vapor deposition (CVD) method. In addition, the specific configuration of the common electrode 53 is not limited.

In such a manner, the organic EL element 12 includes the transparent common electrode 53 disposed on the opposing surface 11 side of the element substrate 10, the pixel electrode 62 disposed on the side opposite to the opposing surface 11 of the common electrode 53, and the organic light emitting layer 52 disposed between the common electrode 53 and the pixel electrode 62. Thus, the top emission type organic EL element 12 that emits light from the common electrode 53 is configured in the display device 100.

The configuration of the organic EL element 12 is not limited. For example, an organic EL element 12 having a cavity structure (resonating structure) may be configured. In the cavity structure, for example, a common electrode 53 having semi-transmittivity and semi-reflectivity is used. Thus, the light emitted from the organic light emitting layer 52 can be subjected to multiple interference between the pixel electrode 62 and the common electrode 53. In this case, light having a predetermined wavelength intensified by the multiple interference is emitted from the common electrode 53.

In the cavity structure, light having a wavelength corresponding to an optical distance between the pixel electrode 62 and the common electrode 53 is emitted. Thus, for example, when the thickness of the pixel electrode 62 is appropriately adjusted, it is possible to extract light having a desired wavelength. This makes it possible to improve the light extraction efficiency in the organic EL element 12 and to control the emission spectrum.

Further, the organic EL elements 12 capable of respectively emitting red light, green light, and blue light may be configured. For example, using the cavity structure described above, the organic EL elements 12 that emit light beams of the respective colors of R, G, and B can be configured. Alternatively, the organic EL elements 12 that emit light beams of the respective colors of R, G, and B may be configured by respectively stacking the organic light emitting layers 52 that emit red light, green light, and blue light.

The protective film 54 is a transparent film having light transmittivity for protecting the organic EL element 12 from moisture, oxygen, and the like present in the atmosphere. The protective film 54 is formed so as to cover the common electrode 53. The example shown in FIG. 4 schematically shows the protective film 54 formed from the display portion 23 to the peripheral portion 24 so as to cover the entire surface of the common electrode 53.

The protective film 54 is formed using, for example, an inorganic compound. As the inorganic compound, $SiO_x$ (silicon oxide), $SiN_x$ (silicon nitride), $SiO_xN_y$ (silicon oxide nitride), $Al_xO_y$ (aluminum oxide), and the like, which have high barrier property to moisture or oxygen, are used. These inorganic compounds are formed by, for example, a vacuum vapor deposition method, a sputtering method, a CVD method, or an ion plating method.

Note that the protective film 54 may be formed of a single layer or may be formed by stacking a plurality of films. For example, when the element substrate 10 is actually configured, the surface of the organic EL element 12 or the like (common electrode 53) may include irregularities. So, for the purpose of improving the accuracy of stacking the color filter layer 30 to be disposed on the upper layer, or the like, the protective film 54 may be planarized. Note that FIG. 4 schematically shows the interface of the circuit layer 50 (metal electrode layer 51), the interface of the common electrode 53, or the like as a plane.

In the case of planarizing the protective film 54, for example, a planarizing film is provided between the layers formed of an inorganic compound. As the planarizing film, for example, a resin material (epoxy resin, urethane resin, silicon resin, or the like) having transparency and having thermosetting property or ultraviolet curable property is used. These resins are appropriately applied onto a layer previously stacked and formed of an inorganic compound. Then, the resin material is cured, and an inorganic compound is newly stacked. Thus, it is possible to form the opposing surface 11 in which irregularities or the like of the lower layer are mitigated, and to accurately stack the color filter layer 30.

The color filter layer 30 is disposed on the opposing surface 11 to avoid the bonding region 16 provided in the peripheral region 14 surrounding the display region 13 of the opposing surface 11. In the display device 100, the color filter layer 30 is stacked on the surface of the protective film 54 that is the opposing surface 11. In this embodiment, the color filter layer 30 corresponds to a color filter layer.

The color filter layer 30 is formed by stacking a plurality of colored layers that allows light having different wavelengths to pass therethrough. Specifically, a red colored layer that transmits red light having a wavelength of about 610 nm, a green colored layer that transmits green light having a wavelength of about 550 nm, and a blue colored layer that transmits blue light having a wavelength of about 470 nm are used. As a result, for example, it is possible to extract each color light beam of R, G, and B independently with high accuracy.

As shown in FIG. 4, the color filter layer 30 has a first color filter 31 disposed in the display region 13 and a second color filter 32 disposed in the peripheral region 14 to avoid the bonding region 16. In this embodiment, the first color filter corresponds to a first color filter, and the second color filter corresponds to a second color filter.

The first color filter 31 is a colored filter that colors the light of the organic EL element 12. That is, the first color filter 31 converts the emission spectrum of light emitted from the opposing surface 11 into light corresponding to the wavelength of the colored layer. Hereinafter, the first color filter 31 may be referred to as a colored filter 31 using the same reference numeral.

The colored filter 31 is disposed on the opposing surface 11 so as to overlap with the pixel electrode 62 for each of the plurality of pixels P (organic EL elements 12). In the example shown in FIG. 4, a colored filter 31R, a colored filter 31G, and a colored filter 31B are respectively disposed to correspond to the three pixels P.

The colored filter 31R including a red colored layer is disposed for the pixel P on the left side in the drawing, the colored filter 31G including a green colored layer is disposed for the central pixel P, and the colored filter 31B including a blue colored layer is disposed for the pixel P on the right side. For example, white light emitted from the left-side pixel P (organic EL element 12) passes through the colored filter 31R and is then emitted as red light toward the transparent substrate 20 disposed on the upper layer. Similarly, green light is emitted from the central pixel P, and blue light is emitted from the right-side pixel P.

As described above, the three pixels P shown in FIG. 4 function as sub-pixels that emit the respective color light beams of R, G, and B. For example, when the output (light amount) of each organic EL element 12 corresponding to each pixel P is adjusted, it is possible to represent an arbitrary color.

Note that even when the organic EL elements 12 are configured to emit the respective color light beams, the emission spectra of the respective color light beams can be accurately adjusted by using the colored filters 31. In this case, for example, the organic EL element 12 is configured to emit color light similar to that of the corresponding colored filter 31. Thus, for example, even when there is unevenness or the like in the emission spectrum for each organic EL element 12, it is possible to accurately adjust the wavelengths of the respective color light beams emitted toward the transparent substrate 20 by passing the light through the colored filter 31. As a result, high-quality image display is made possible.

The second color filter 32 is a light shielding filter that shields the metal electrode layer 51 from light. For example, light passing through the transparent substrate 20 toward the metal electrode layer 51 is blocked by the second color filter 32. That is, the amount of light reaching the metal electrode layer 51 is suppressed. In the following, the second color filter 32 may be referred to as a light shielding filter 32 using the same reference numeral.

In the example shown in FIG. 4, the light shielding filters 32 in each of which the blue colored layer is stacked on the red colored layer are disposed so as to be separated from each other with the bonding region 16 interposed therebetween. For example, white light incident from the transparent substrate 20 is converted into blue light by the blue colored layer of the light shielding filter 32. Such blue light contains almost no spectral component of the red light and the like, and is thus substantially absorbed by the red colored layer disposed in the lower layer. As a result, external light such as white light incident through the light shielding filter 32 is sufficiently attenuated before reaching the metal electrode layer 51.

When the red colored layer and the blue colored layer having largely different wavelengths are stacked to form the light shielding filter 32 in such a manner, the metal electrode layer 51 can be sufficiently shielded from light. The configuration of the light shielding filter 32 is not limited. For example, a configuration in which the red colored layer and the green colored layer are stacked, a configuration in which the blue colored layer and the green colored layer are stacked, or the like may be used. Alternatively, a light shielding filter 32 in which all of the colored layers of R, G, and B are stacked may be used. Note that light incident on the bonding region 16 where the light shielding filter 32 is not disposed enters the lower layer as it is.

The color filter layer 30 (each colored layer of R, G, and B) is formed using, for example, a photosensitive resin material obtained by kneading a coloring material (dye or the like) exhibiting a predetermined color. For example, a colored photosensitive resin material is applied onto the opposing surface 11 by a spin coating method or the like, and a predetermined pattern is formed by a photolithography method. For example, a red colored layer is formed, a green colored layer is then formed, and a blue colored layer is finally formed. Thus, it is possible to simultaneously form the multi-layer light shielding filter 32 in the process of forming the single-layer colored filter 31. Of course, the order or the like in which each colored layer is stacked is not limited.

The transparent adhesive layer 40 bonds the transparent substrate 20 and the element substrate 10 to each other via the bonding region 16. The bonding region 16 is a region of the peripheral region 14 where the color filter layer (light shielding filter 32) is not provided and the surface of the protective film 54 that is the opposing surface 11 is exposed. Therefore, when the transparent adhesive layer 40 is applied to the bonding region 16 and bonds the transparent substrate 20 thereto, the opposing surface 11 and the transparent substrate 20 are directly bonded to each other without interposing the color filter layer 30. The transparent adhesive layer 40 is typically applied to the application region (see FIG. 1) including the bonding region 16 so as to completely surround the display region 13.

Note that the transparent adhesive layer 40 is also applied to the color filter layer 30 around the bonding region 16. Therefore, the element substrate 10 includes a region where the transparent substrate 20 is directly bonded (bonding region 16), and a region bonded through the color filter layer 30 (light shielding filter 32).

In this embodiment, the transparent adhesive layer 40 is a sealant 42 applied so as to surround the display region 13. The sealant 42 is an adhesive having transparency and is a sealing material for sealing the filler 41 provided in the display region 13. For example, a thermosetting type or photocurable type epoxy adhesive is used as the sealant 42. In addition, any adhesive having transparency may be used as the sealant 42.

The sealant 42 is a viscous paste-like material in an uncured state. For the application of the sealant 42, for example, a sealant application apparatus or the like is used, which supplies a paste-like sealant 42 from a dedicated nozzle and applies the sealant 42 with a predetermined width. For example, the sealant 42 is applied to the element substrate 10, on which the color filter layer 30 is formed, by the sealant application apparatus or the like with the bonding region 16 as a reference. Thus, it is possible to reliably apply the sealant 42 to the belt-like bonding region 16.

The filler 41 is a transparent resin material that is provided inside a region where the sealant 42 (transparent adhesive layer 40) is applied. The filler 41 is, for example, less viscous than the sealant 42 and is a material capable of filling gaps or the like between the colored filters 31 without any gap. The filler 41 functions as a spacer and a protective layer between the transparent substrate 20 and the color filter layer 30 (element substrate 10).

Further, the filler 41 is an adhesive that is, for example, cured by a predetermined curing process to bond the transparent substrate 20 and the element substrate 10 to each other. In this case, the filler 41 functions as the transparent adhesive layer 40 similarly to the sealant 42. The type or the like of the filler 41 is not limited. For example, any resin material having transparency may be used as the filler 41.

When the sealant 42 is applied and the filler 41 is provided, the transparent substrate 20 is attached. The curing process for curing the sealant 42 and the filler 41 (such as heat treatment or a light irradiation process) is then performed to bond the transparent substrate 20 and the element substrate 10 to each other. Alternatively, after the transparent substrate 20 and the element substrate 10 are bonded to each other using only the sealant 42, the filler 41 is provided in a region surrounded by the sealant 42 and each substrate, and a predetermined curing process is performed. As a result, the display device 100 in which the transparent substrate 20 and the element substrate 10 are directly bonded to each other via the bonding region 16 is provided.

Figure 5A:
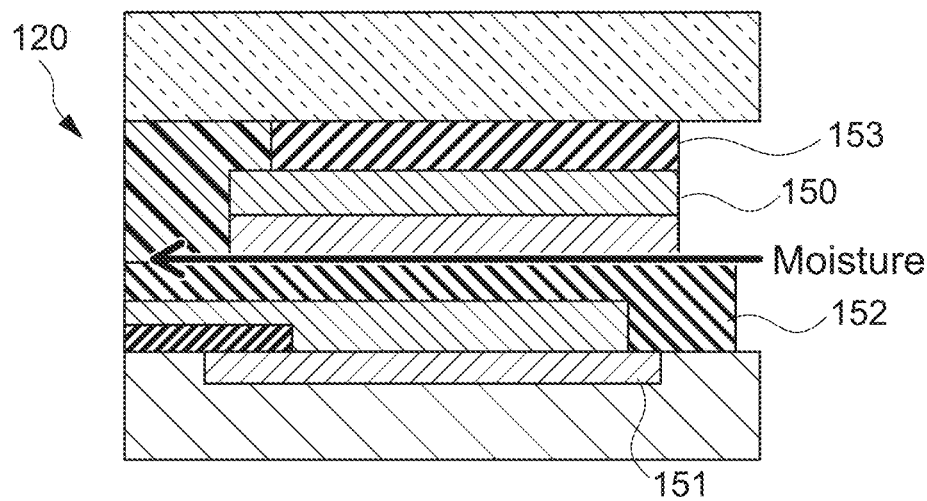
FIGS. 5A, 5B, and 5C are schematic diagrams showing an example of a cross-sectional structure of a display device shown as a comparative example.
Figure 5B:
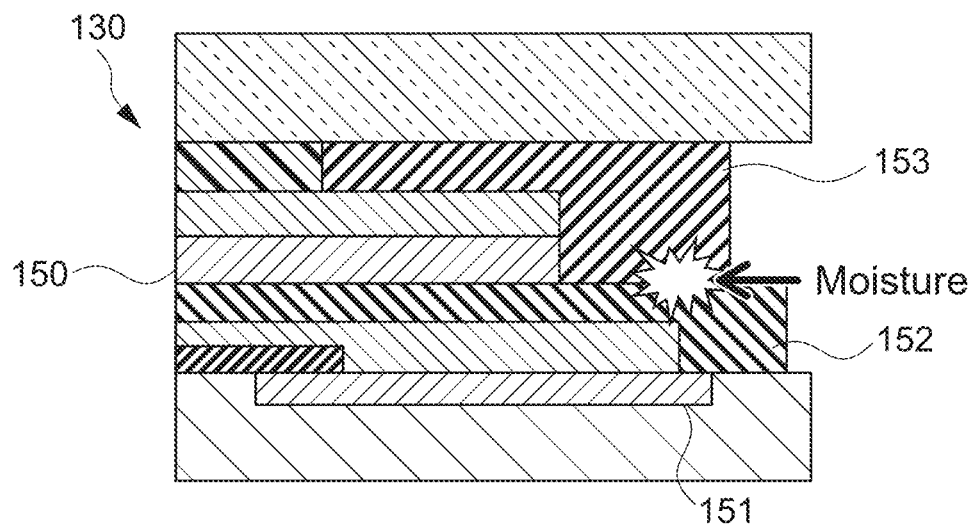
Figure 5C:
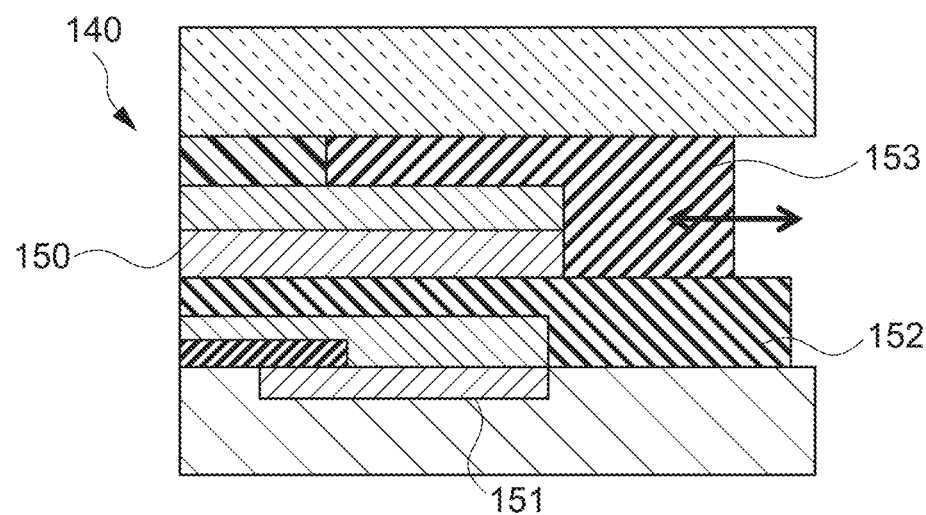

FIGS. 5A, 5B, and 5C are schematic diagrams showing examples of cross-sectional structures of display devices shown as comparative examples. FIGS. 5A, 5B, and 5C schematically show cross-sectional structures of peripheral portions of display devices 120, 130, and 140 shown as comparative examples. In each display device, a color filter layer 150 is disposed outside the display region for the purpose of blocking the light reflection from a metal electrode layer 151 (lower metal) disposed in the lower layer and of reducing the level difference, for example.

In general, in an element including an organic light emitting layer or the like, the heat-resistant temperature of an organic substance constituting the organic light emitting layer serves as a limiter, and the maximum temperature at which the element or the substrate can be heated is relatively low in many cases. For this reason, for example, it is necessary to form the color filter layer 150 at a relatively low temperature, which may make it difficult to sufficiently cure the color filter layer 150.

In such a case where the curing is insufficient, it is conceivable that the adhesiveness of the contact surface between the color filter layer 150 and a protective film 152 is lowered. Therefore, there may be a possibility that moisture, oxygen, or the like intrudes from the contact surface between the color filter layer 150 and the protective film 152, or a possibility that peeling occurs at the contact surface between the color filter layer 150 and the protective film 152.

As shown in FIG. 5A, in the display device 120, a transparent adhesive layer 153 is bonded only to the color filter layer 150. The end surface of the color filter layer 150 is exposed without being covered with the transparent adhesive layer 153 (sealant). In this case, since the adhesiveness between the color filter layer 150 and the protective film 152 is low as described above, peeling or the like due to the intrusion of moisture may occur. In addition, if moisture, oxygen, or the like intrudes, there is a possibility that the organic EL element or the like is deteriorated, and the reliability of the device is reduced.

As a countermeasure against such a problem, it is conceivable that the end surface of the color filter layer 150 is placed within the transparent adhesive layer 153 in order to create a cross-sectional structure in which the transparent adhesive layer 153 and the color filter layer 150 are not in contact with each other. As shown in FIG. 5B, in the display device 130, the color filter layer 150 is set shorter than that of the display device 120, and the end surface of the color filter layer 150 is covered with the transparent adhesive layer 153. Thus, the intrusion of moisture from the end surface of the color filter layer 150 is suppressed.

Meanwhile, it is conceivable that the end surface of the transparent adhesive layer 153 (sealant) varies in a process such as sealant application. For example, when the transparent adhesive layer 153 protrudes from the end surface of the display device 130, the cutting accuracy may be lowered in a singulation process such as dicing. So, considering the variations in position of the end surface in a range where the transparent adhesive layer 153 does not protrude from the end surface of the display device 130, it is necessary to sufficiently reduce the size of the color filter layer 150. As a result, in the case where the color filter layer 150 is installed for the purpose of light shielding, the light shielding performance at the outer peripheral end portion of the display device 130 is greatly lowered.

It is also conceivable that the metal electrode layer 151 serving as a lower metal is also reduced in size according to the color filter layer 150 in order to maintain the light shielding performance. As shown in FIG. 5C, in the display device 140, the metal electrode layer 151 is reduced in size such that light can be blocked by the color filter layer 150. In this case, it is impossible to ensure a wiring width necessary as a peripheral circuit, which results in a decrease in image quality due to a voltage drop.

Hereinafter, the peripheral portion 24 of the display device 100 according to this embodiment will be described with reference to FIGS. 1 and 4.

As shown in FIG. 4, the peripheral portion 24 of the display device 100 has a cross-sectional structure in which the transparent adhesive layer 40 (sealant 42) that bonds the element substrate 10 and the transparent substrate 20 to each other does not come into contact with the color filter layer 30 (light shielding filter 32). A region of the cross-sectional structure that is in contact with the opposing surface 11 serves as the bonding region 16. Therefore, the sealant 42 is bonded directly to the opposing surface 11 at least in the bonding region 16.

In such a manner, in this embodiment, rather than reducing the size of the color filter layer from the outer peripheral portion of the display device to create a cross-sectional structure in which the transparent adhesive layer and the color filter layer do not come into contact with each other as in the comparative example described with reference to FIGS. 5A, 5B, and 5C, a slit (bonding region 16) is provided in the color filter layer 30 in a region where the transparent adhesive layer 40 is certainly present without being affected by manufacturing variations to create a desired cross-sectional structure. In addition, a configuration in which the metal electrode layer 51 serving as the lower metal does not exist according to the slit is employed.

As a result, high adhesiveness is obtained in the bonding region 16, and the intrusion of moisture, oxygen, or the like from the end portion of the display device 100 can be sufficiently suppressed. Thus, it becomes possible to avoid deterioration or the like of the organic EL element 12 or the filler 41, which is caused by incorporation of moisture, oxygen, or the like, and to greatly improve the reliability of the device.

Further, as shown in FIG. 1, when the display device 100 is viewed in plan view, the bonding region 16 is a band-shaped region surrounding the display region 13. Thus, the display region 13 is completely surrounded by the bonding region 16. Thus, the organic EL element 12 or the like disposed in the lower layer of the display region 13 is confined in a space with sufficiently high adhesiveness, and the deterioration or the like of the element can be sufficiently avoided.

In the display device 100, the metal electrode layer (peripheral electrode 60) is disposed so as to avoid the overlapping region 18 overlapping with the bonding region 16. Therefore, the peripheral electrode 60 having high reflectance is also not disposed directly below the bonding region 16 where the color filter layer 30 (light shielding filter 32) is not disposed. Thus, for example, even when the external light or the like is incident from the transparent substrate 20 side, it is possible to sufficiently avoid a situation where unnecessary reflection, glare, or the like occurs in the peripheral portion (peripheral region 14). Thus, in the display device 100, the light shielding performance is maintained at a high level in the periphery (frame) of the image to be displayed. As a result, high-quality image display can be achieved.

Further, in this embodiment, the peripheral electrode 60 is divided into the partial electrodes 61 with the overlapping region 18 interposed therebetween, and the common electrode 53 is connected to each of the partial electrodes 61. As a result, it is possible to avoid deterioration or the like of the contact resistance. Since the peripheral electrode 60 can be divided into the plurality of partial electrodes 61 in such a manner, it is possible to ensure a region where lower layer wiring such as the peripheral electrode 60 can be disposed while maintaining the light shielding performance. Thus, deterioration or the like of the image quality due to the voltage drop caused by miniaturizing the wiring of the peripheral electrode 60 is avoided, and it is possible to maintain the image quality.

Hereinabove, in the display device 100 according to this embodiment, the opposing surface 11 of the element substrate 10 including the organic EL element 12 is directed to the transparent substrate 20. The color filter layer 30 is disposed on the opposing surface 11 so as to avoid the bonding region 16 provided in the peripheral region 14 surrounding the display region 13. Further, in the element substrate 10, the metal electrode layer 51 is disposed so as to avoid at least a part of the overlapping region 18 overlapping with the bonding region 16 when viewed from the transparent substrate 20. The transparent substrate 20 and the element substrate 10 are bonded to each other by the transparent adhesive layer 40 via the bonding region 16. As a result, the bonding performance of each substrate is improved, and the reflection of the metal electrode layer 51 is suppressed, so that it is possible to improve the reliability of the device and to achieve high-quality image display.

Second Embodiment

A display device according to a second embodiment of the present technology will be described. In the following description, descriptions of configurations and effects similar to those in the display device 100 described in the above embodiment will be omitted or simplified.

Figure 6A:
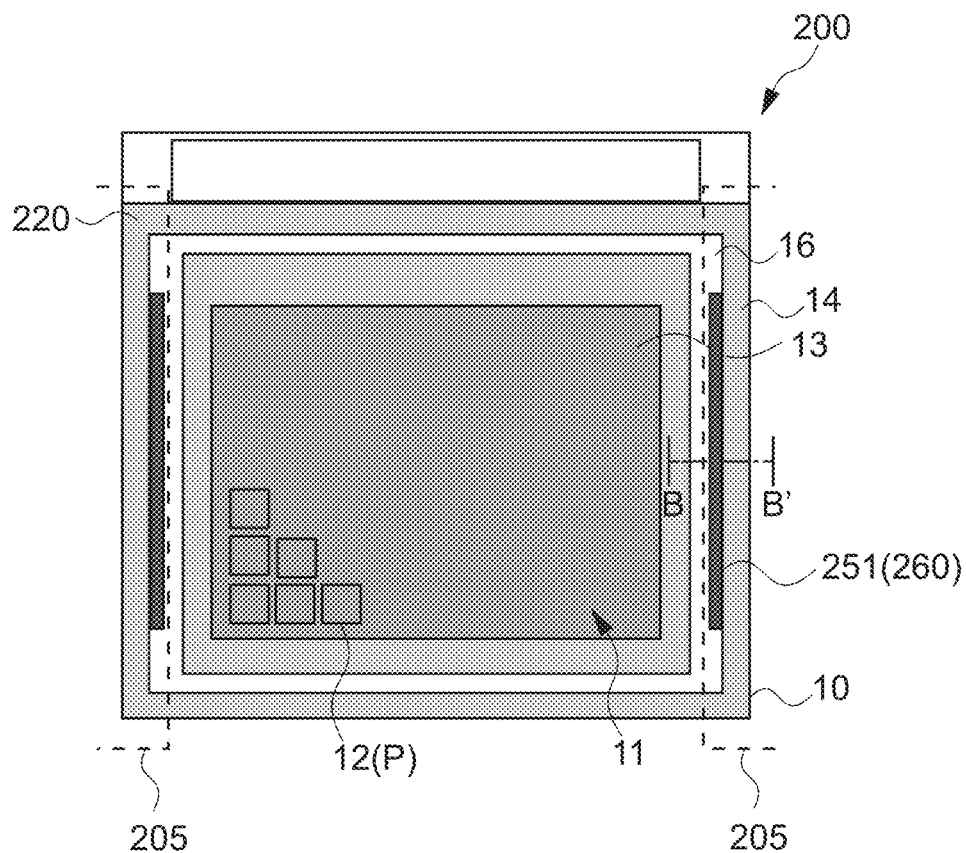
FIGS. 6A and 6B are schematic diagrams showing a configuration example of a display device according to a second embodiment.
Figure 6B:
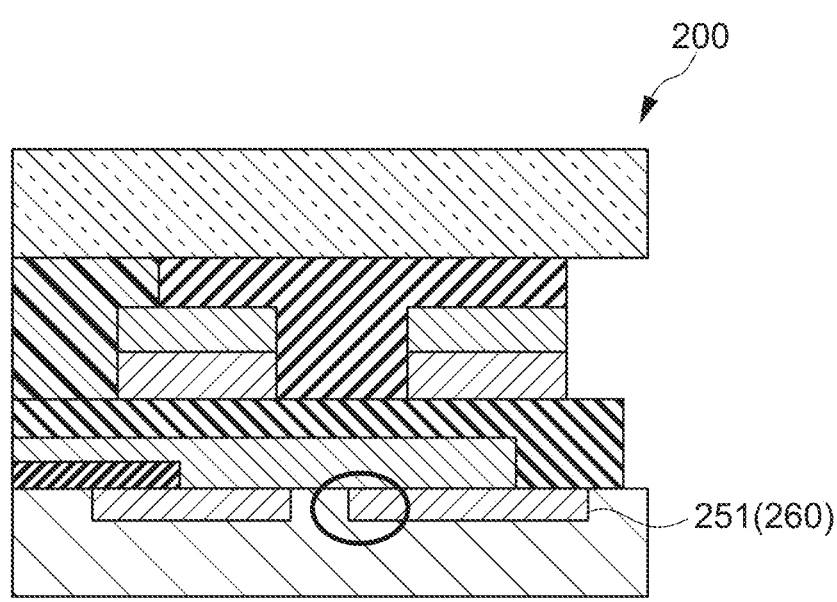

FIGS. 6A and 6B are schematic diagrams showing a configuration example of a display device 200 according to the second embodiment. FIG. 6A is a plan view schematically showing the display device 200 when viewed from a transparent substrate 220. FIG. 6B is a schematic cross-sectional view showing a configuration example of a peripheral portion of the display device 200 taken along the line BB' shown in FIG. 6A.

As shown in FIG. 6B, in this embodiment, a peripheral electrode 260 of a metal electrode layer 251 is provided in a part of an overlapping region 18 overlapping with a bonding region 16 where a color filter layer 230 is not provided. FIG. 6A schematically shows the peripheral electrode 260 that protrudes to a part of the overlapping region 18 and is visible through the bonding region 16. In such a manner, the metal electrode layer 251 may be disposed so as to avoid at least a part of the overlapping region 18.

For example, as shown in FIG. 6A, when a housing 205 (a dotted line in the drawing) or the like that fixes the display device 200 overlaps with the bonding region 16, the bonding region 16 itself is shielded from light by the housing 205. Alternatively, the bonding region 16 may be hidden in a range that is not visible in normal use. As described above, for a region or the like where light shielding is not necessary, the peripheral electrode 260 is provided even in the overlapping region 18.

Thus, it is possible to dispose the peripheral electrode in a wider range without reducing the light shielding performance. As a result, the degree of freedom of design is increased, and it is also possible to increase the line width or the like of the wiring, and to easily achieve high-quality image display.

Third Embodiment

Figure 7:
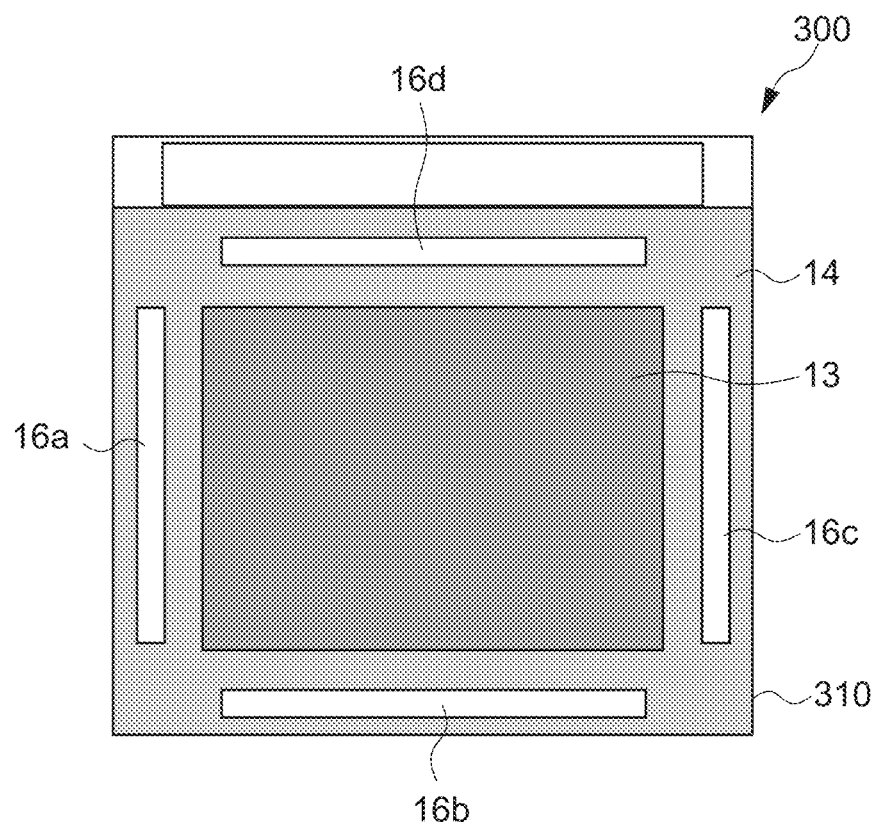
FIG. 7 is a schematic diagram showing a configuration example of a display device according to a third embodiment.

FIG. 7 is a schematic diagram showing a configuration example of a display device 300 according to a third embodiment. As shown in FIG. 7, in the display device 300, a bonding region 16 is provided in a part of the periphery of a display region 13. In the example shown in FIG. 7, four bonding regions 16a to 16d disposed around the display region 13 are provided. The bonding regions 16a to 16d are rectangular regions and are disposed in a peripheral region 14 along the left side, the lower side, the right side, and the upper side of the display region 13, respectively.

In such a manner, the bonding region 16 does not need to surround the entire circumference of the display region 13 (effective pixel area). When the display region 13 is divided into a plurality of regions to be disposed in such a manner, for example, it is possible to selectively shield from light an area in which the peripheral electrodes are concentrated, and to provide the bonding regions 16 in an area in which the peripheral electrodes are sparsely disposed. Thus, for example, it is possible to reliably shield from light a region where light shielding is necessary because of the configuration of the circuit.

Although there is a possibility that an intrusion route of moisture, oxygen, or the like remains if the bonding region 16 is not provided, for example, appropriately designing the size of the bonding region 16 or the like makes it possible to configure the display device 300 capable of maintaining reliability in the actual use time even if the intrusion route of moisture remains.

Fourth Embodiment

Figure 8:
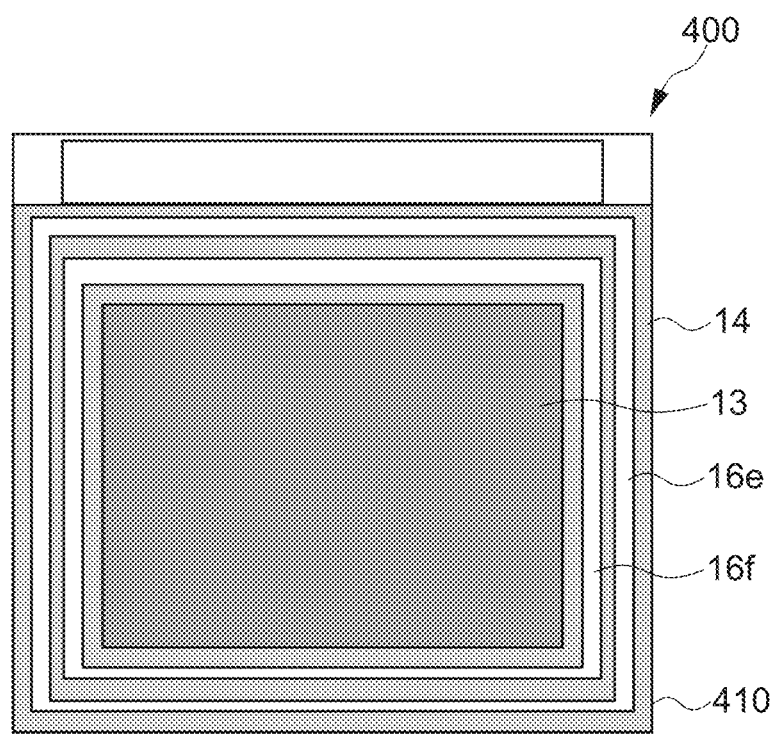
FIG. 8 is a schematic diagram showing a configuration example of a display device according to a fourth embodiment.

FIG. 8 is a schematic diagram showing a configuration example of a display device 400 according to a fourth embodiment. As shown in FIG. 8, in the display device 400, a bonding region 16 includes a plurality of belt-like regions surrounding a display region 13. In the example shown in FIG. 8, two belt-like regions, i.e., a belt-like bonding region 16e disposed so as to surround the display region 13 and a belt-like bonding region 16f surrounding the bonding region 16e, are provided.

Further, in the display device 400, peripheral electrodes or the like of a metal electrode layer are not disposed in a region (overlapping region 18) on an element substrate 410 overlapping with the bonding regions 16e and 16f. In such a manner, even when a plurality of belt-like bonding regions 16 is provided, it is possible to sufficiently maintain the light shielding performance.

In addition, the outer bonding region 16e and the inner bonding region 16f prevent the intrusion of moisture or the like. Thus, even when the intrusion of moisture occurs in the bonding region 16e, for example, the bonding region 16f can reliably prevent the intrusion of moisture. When multiple bonding regions 16 are disposed in such a manner, it is possible to greatly improve the performance of preventing the intrusion of moisture. Note that the number of belt-like bonding regions 16 to be provided or the like is not limited. For example, a bonding region of a triple structure or a quadruple structure may be provided.

Fifth Embodiment

Figure 9:
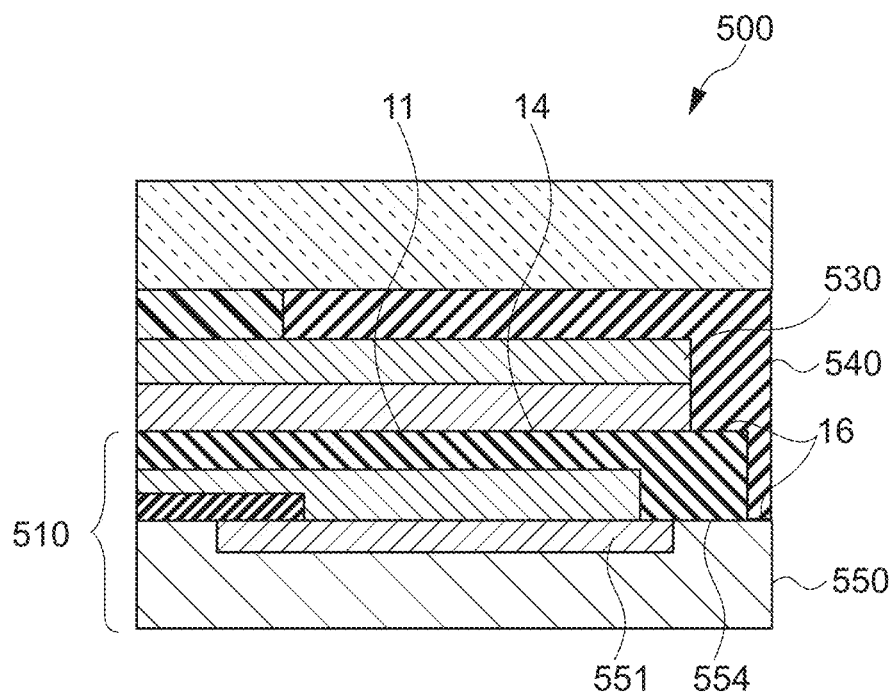
FIG. 9 is a schematic diagram showing a configuration example of a display device according to a fifth embodiment.

FIG. 9 is a schematic diagram showing a configuration example of a display device 500 according to a fifth embodiment. FIG. 9 schematically shows a cross-sectional structure of the peripheral portion of the display device 500. In the display device 500, a bonding region 16 is provided on the outer edge of a peripheral region 14.

Here, the outer edge of the peripheral region 14 is, for example, an outer peripheral portion of an element substrate 510. In the outer peripheral portion of the element substrate 510, for example, a region where the surface of a circuit layer 550 is exposed and a region where the surface of a protective film 554 is exposed are present. These regions are part of an opposing surface 11 of the element substrate 510 and correspond to the peripheral region 14. In this embodiment, the bonding region 16 is disposed on the surfaces of the protective film 554 and the circuit layer 550 exposed in the outer peripheral portion of the element substrate 510.

In such a manner, the bonding region 16 is disposed at a position far from the display region 13 that the user is watching. Thus, the bonding region 16 is difficult to enter the field of view of the user, so that the user can enjoy the image display without caring the bonding region 16. Therefore, providing the bonding region 16 at the outer edge makes it possible to provide the display device 500 having high compatibility with an actual use environment.

Further, as shown in FIG. 9, a color filter layer 530 is disposed to the vicinity of the outer edge of the peripheral region 14 in the display device 500. Further, in the lower layer of the color filter layer 530, a metal electrode layer 551 is disposed to the vicinity of the outer edge of the element substrate 510 similarly to the color filter layer 530. In such a manner, in the display device 500, the metal electrode layer 551 can be disposed in a wide range and can be reliably shielded from light. Note that the end portion of the color filter layer 530 is covered with a transparent adhesive layer 540, so that the intrusion of moisture or the like can be reliably prevented.

Sixth Embodiment

Figure 10:
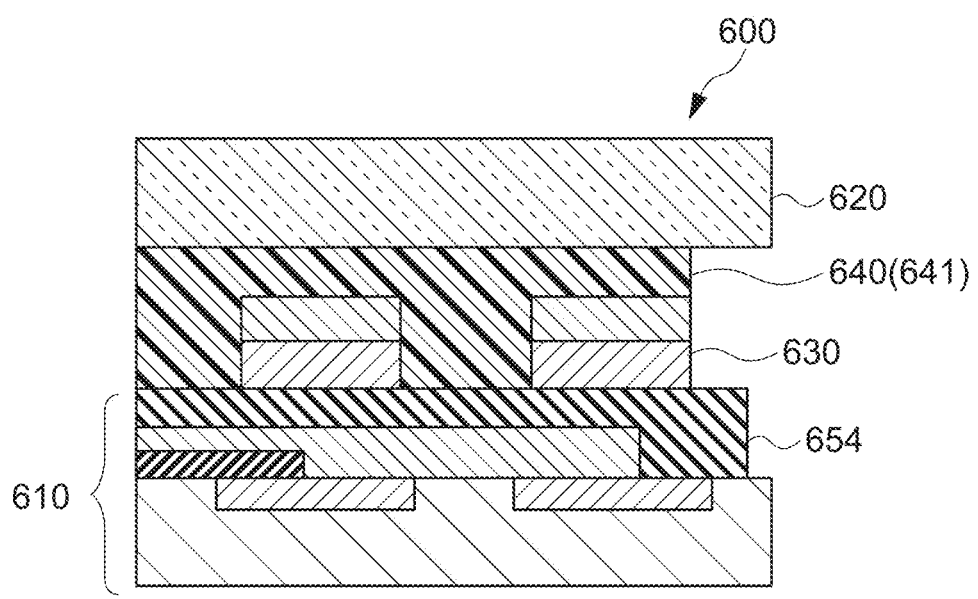
FIG. 10 is a schematic diagram showing a configuration example of a display device according to a sixth embodiment.

FIG. 10 is a schematic diagram showing a configuration example of a display device 600 according to a sixth embodiment. FIG. 10 schematically shows a cross-sectional structure of the peripheral portion of the display device 600. In the display device 600, a filler 641 provided between a transparent substrate 620 and an element substrate 610 is used as a transparent adhesive layer 640. That is, in the display device 600, the transparent substrate 620 and the element substrate 610 are bonded to each other by a single filler 641 without using a sealant. Even when a single filler 641 is thus used as the transparent adhesive layer 640, the present technology is applicable.

For example, after a color filter layer 630 is formed on a protective film 654 of the element substrate 610, the filler 641 is applied to the element substrate 610. As the filler 641, for example, a transparent adhesive or the like having such a viscosity that it does not flow out of a specified application region is used. Subsequently, the transparent substrate 620 is attached to the element substrate 610 to which the filler 641 has been applied, and a predetermined curing process is performed. Thus, for example, it is possible to remove the process of applying a sealant, and to simplify the manufacturing process.

Other Embodiments

The present technology is not limited to the embodiments described above and can provide various other embodiments.

In the above description, the case where the metal electrode layer constitutes the pixel electrode of the organic EL element and the peripheral electrode has been described. The present technology is not limited thereto, and the metal electrode layer may constitute a metal reflective film or the like that reflects light of the organic EL element, separately from the pixel electrode of the organic EL element.

For example, a transparent electrode or the like may be used as the pixel electrode of the organic EL element. In such a case, a metal reflective film or the like that reflects light, which is emitted to the pixel electrode side, to the common electrode side is formed. The metal reflective film may be formed of the metal electrode layer. Note that the peripheral electrode constituted by the metal electrode layer is a metal film having high reflectance. Even in such a case, for example, as described with reference to FIG. 4 and the like, the metal electrode layer is disposed so as not to overlap with the bonding region, and thus it is possible to sufficiently maintain the light shielding performance.

In the above description, the display device including the top emission type organic EL element that emits light from the common electrode side has been described, but the present technology is not limited thereto. For example, a bottom emission type organic EL element that emits light from the pixel electrode side may be used. In this case, the color filter layer and the transparent substrate are disposed on the side opposite to the side where the organic EL element (organic light emitting layer) is formed in the element substrate.

In the bottom emission type organic EL element, for example, a transparent pixel electrode is formed on a transparent element substrate (glass substrate, etc.). An organic light emitting layer and a common electrode are formed above the pixel electrode. Here, the common electrode functions as a metal reflective film that reflects light. Alternatively, a metal reflective film may be provided separately from the common electrode. Below the pixel electrode, for example, a window portion from which light of the organic EL element is extracted is formed, and a pixel circuit or the like is disposed around the window portion. The window portion corresponding to each organic EL element is formed in the element substrate, and the region where each window portion is formed serves as a display region where an image is to be displayed.

On the lower side of the element substrate, a color filter layer is provided to avoid a bonding region provided around the display region. In addition, a sealant or the like is applied to the bonding region to bond a transparent substrate. Note that, in the element substrate, the electrode formed of a metal film having high reflectance (the above-mentioned metal reflective film or the like) is disposed so as not to overlap with the bonding region.

Light generated by the organic light emitting layer passes through the pixel electrode, the window portion, and the color filter layer and is emitted from the transparent substrate. Even in such a configuration, the color filter layer is disposed so as to avoid the bonding region, so that it is possible to prevent the intrusion of moisture or the like and avoid the occurrence of display defects and the like. In addition, since the element substrate and the transparent substrate are directly bonded to each other, peeling or the like between the substrates can be prevented. In addition, since the metal film having high reflectance is disposed so as not to overlap with the bonding region, it is possible to sufficiently maintain the light shielding performance of the periphery.

FIGS. 11A, 11B, 12A, 12B, 13, and 14 are schematic diagrams each showing an example of an electronic apparatus equipped with a display device according to another embodiment. In the above description, the display device configured as a module has been described. The present technology is applicable to various electronic apparatuses in which the display device is mounted. Hereinafter, examples of other display devices will be described with reference to FIGS. 11A, 11B, 12A, 12B, 13, and 14.

Figure 11A:
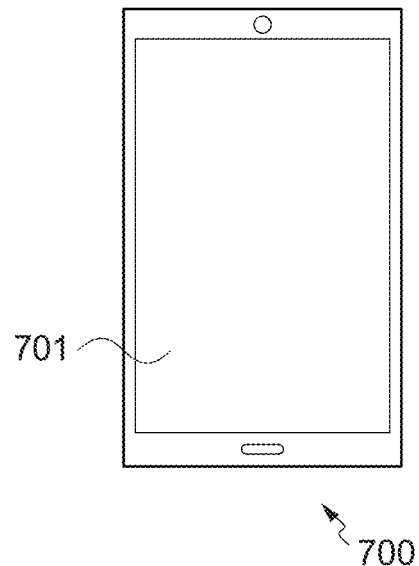
FIGS. 11A and 11B are schematic diagrams showing an example of an electronic apparatus equipped with a display device.
Figure 11B:
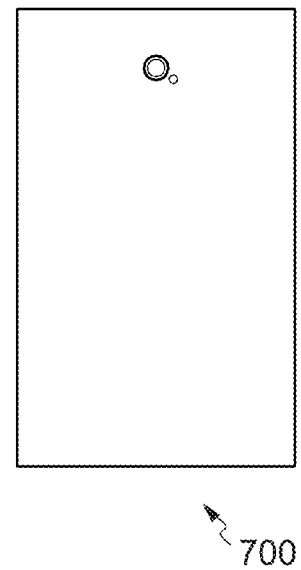

FIGS. 11A and 11B show the appearance of a mobile terminal. FIG. 11A is a front view of a mobile terminal 700, and of FIG. 11B is a rear view of the mobile terminal 700. A display 701 for display is disposed in front of the mobile terminal 700. The display device described above can be used as the display 701.

Figure 12A:
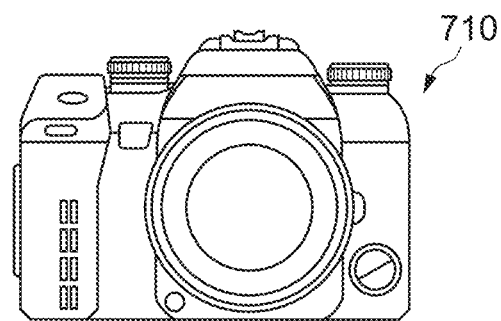
FIGS. 12A and 12B are schematic diagrams showing an example of an electronic apparatus equipped with a display device.
Figure 12B:
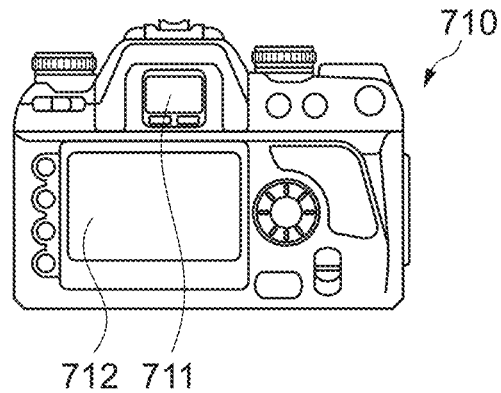

FIGS. 12A and 12B show the appearance of a digital camera. FIG. 12A is a front view of a digital camera 710, and FIG. 12B is a rear view of the digital camera 710. The digital camera 710 includes a viewfinder unit 711, and the display device or the like described above is used for the viewfinder unit 711. In this case, the display device is configured as a microdisplay. Further, the digital camera 710 also includes a rear display 712. The display device may be used for the rear display 712.

Figure 13:
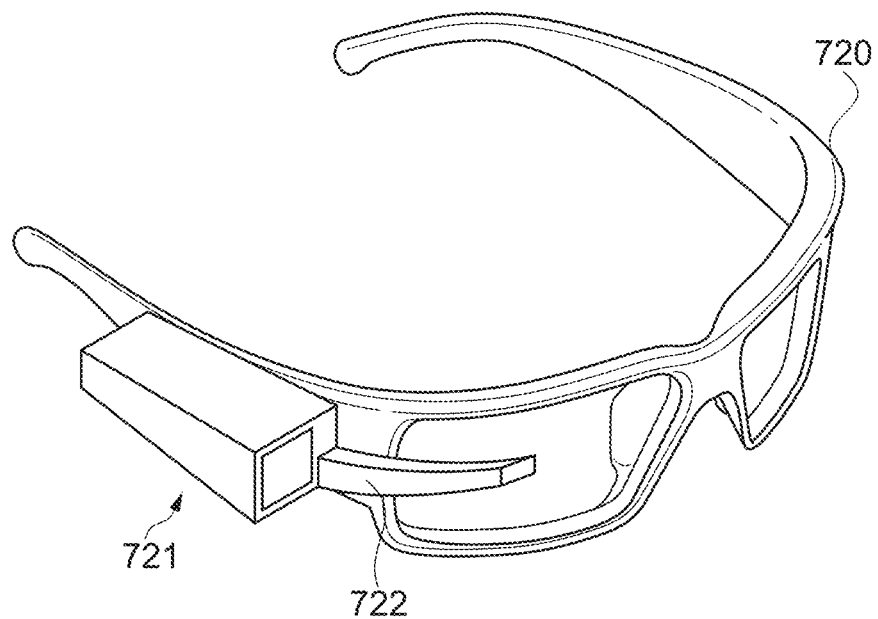
FIG. 13 is a schematic diagram showing an example of an electronic apparatus equipped with a display device.

FIG. 13 shows the appearance of an eyewear 720 such as eyeglasses, goggles, and sunglasses in which an eyewear-mounted type one-eye display module 721 is mounted. The eyewear-mounted type one-eye display module 721 includes, for example, a light source and an organic EL element 722. The display device or the like described above is applied to the organic EL element.

Figure 14:
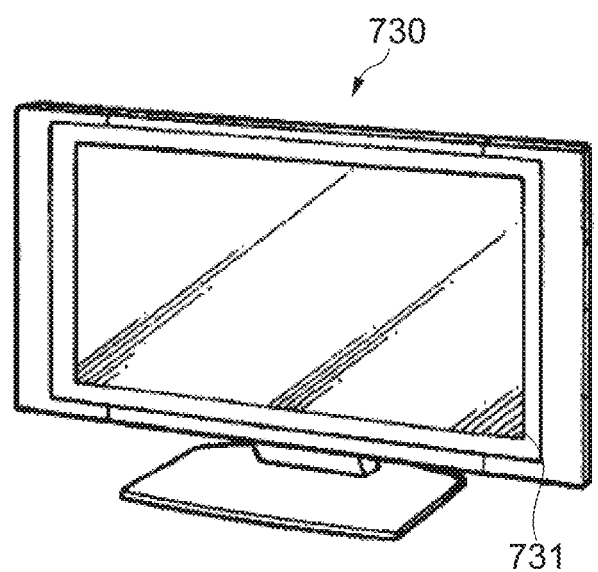
FIG. 14 is a schematic diagram showing an example of an electronic apparatus equipped with a display device.

FIG. 14 shows the appearance of a television apparatus 730 as an electronic apparatus. The television apparatus 730 includes a flat panel type organic EL display 731. The display device described above can be used as the organic EL display 731.

Of the feature portions according to the present technology described above, at least two feature portions can be combined. That is, the various feature portions described in the embodiments may be arbitrarily combined without distinguishing between the embodiments. Further, the various effects described above are not limitative but are merely illustrative, and other effects may be provided.

In the present disclosure, "same", "equal", "orthogonal", and the like are concepts including "substantially the same", "substantially equal", "substantially orthogonal", and the like. For example, the states included in a predetermined range (e.g., ±10%) with reference to "completely the same", "completely equal", "completely orthogonal", and the like are also included.

Note that the present technology may also take the following configurations.

(1) A display device, including:
a transparent substrate;
an element substrate including
an opposing surface facing the transparent substrate, and
an organic EL element that emits light from a display region of the opposing surface;
a color filter layer disposed on the opposing surface to avoid a bonding region provided in a peripheral region surrounding the display region of the opposing surface;
a metal electrode layer disposed on the element substrate to avoid at least a part of an overlapping region that overlaps with the bonding region when viewed from the transparent substrate; and
a transparent adhesive layer that bonds the transparent substrate and the element substrate to each other via the bonding region.

(2) The display device according to (1), in which
the color filter layer includes
a first color filter disposed in the display region, and
a second color filter disposed in the peripheral region to avoid the bonding region.

(3) The display device according to (2), in which
the first color filter is a colored filter that colors the light of the organic EL element, and
the second color filter is a light shielding filter that shields the metal electrode layer from light.

(4) The display device according to any one of (1) to (3), in which
the bonding region is provided in at least a part of a periphery of the display region.

(5) The display device according to (4), in which
the bonding region includes one or more belt-like regions surrounding the display region.

(6) The display device according to (4) or (5), in which
the bonding region is provided at an outer edge of the peripheral region.

(7) The display device according to any one of (1) to (6), in which
the metal electrode layer includes
a metal reflective film that reflects the light of the organic EL element, and
a peripheral electrode disposed to avoid at least a part of the overlapping region.

(8) The display device according to (7), in which
the organic EL element includes a transparent common electrode disposed on the opposing surface side of the element substrate, and
the peripheral electrode is electrically connected to the common electrode.

(9) The display device according to (8), in which
the common electrode is disposed on the peripheral electrode.

(10) The display device according to (8) or (9), in which
the peripheral electrode includes a plurality of partial electrodes spaced apart from each other, and the common electrode is disposed on the plurality of partial electrodes.

(11) The display device according to any one of (8) to (10), in which
the organic EL element includes
a pixel electrode disposed on a side of the common electrode opposite to the opposing surface, and
an organic light emitting layer disposed between the common electrode and the pixel electrode, and
the metal reflective film reflects light generated in the organic light emitting layer to the opposing surface.

(12) The display device according to (11), in which
the metal reflective film is the pixel electrode.

(13) The display device according to any one of (8) to (12), in which
the element substrate includes a protective film formed to cover the common electrode, and
the opposing surface is a surface of the protective film that faces the transparent substrate.

(14) The display device according to any one of (7) to (13), in which
the peripheral electrode is a metal film closest to the color filter layer.

(15) The display device according to any one of (1) to (14), in which
the transparent adhesive layer is a sealant applied to surround the display region.

(16) The display device according to any one of (1) to (15), in which
the transparent adhesive layer is a filler provided between the transparent substrate and the element substrate.

(17) An electronic apparatus, including:
a display device including
a transparent substrate,
an element substrate including
an opposing surface facing the transparent substrate, and
an organic EL element that emits light from a display region of the opposing surface,
a color filter layer disposed on the opposing surface to avoid a bonding region provided in a peripheral region surrounding the display region of the opposing surface,
a metal electrode layer disposed on the element substrate to avoid at least a part of an overlapping region that overlaps with the bonding region when viewed from the transparent substrate, and
a transparent adhesive layer that bonds the transparent substrate and the element substrate to each other via the bonding region; and
a drive circuit that drives the display device.

REFERENCE SIGNS LIST 10, 410, 510, 610 element substrate
11 opposing surface
12 organic EL element
13 display region
14 peripheral region
16, 16a to 16f bonding region
18 overlapping region
20, 220, 620 transparent substrate
22 drive circuit
30, 230, 530, 630 color filter layer
31 first color filter
32 second color filter
40, 540, 640 transparent adhesive layer
41 filler
42 sealant
51, 251, 551 metal electrode layer
52 organic light emitting layer
53 common electrode
54, 554, 654 protective film
60, 260 peripheral electrode
61 partial electrode
62 pixel electrode
100, 200, 300, 400, 500, 600 display device

The invention claimed is:
1. A display device, comprising:
a transparent substrate;
an element substrate that includes:
an opposing surface that faces the transparent substrate, wherein
the opposing surface includes a display region and a peripheral region,
the peripheral region surrounds the display region, and
the peripheral region includes a bonding region;
an organic electroluminescent (EL) element configured to emit light from the display region of the opposing surface; and
an overlapping region that overlaps with the bonding region when viewed from the transparent substrate;
a color filter layer on the opposing surface, wherein
the color filter layer includes:
a first color filter in the display region; and
a second color filter in the peripheral region, and
the second color filter avoids the bonding region;
a metal electrode layer on the element substrate, wherein
the metal electrode layer avoids at least a part of the overlapping region; and
a transparent adhesive layer that bonds the transparent substrate to the element substrate via the bonding region.

2. The display device according to claim 1, wherein
the first color filter is configured to color the light of the organic EL element,
the second color filter is a light shielding filter, and
the light shielding filter is configured to shield the metal electrode layer from the light.

3. The display device according to claim 1, wherein
the transparent adhesive layer is a sealant, and
the sealant surrounds the display region.

4. The display device according to claim 1, wherein
the transparent adhesive layer is a filler, and
the filler is between the transparent substrate and the element substrate.

5. The display device according to claim 1, wherein the bonding region is in at least a part of a periphery of the display region.

6. The display device according to claim 5, wherein
the bonding region includes one or more belt-like regions, and
the one or more belt-like regions surround the display region.

7. The display device according to claim 5, wherein the bonding region is at an outer edge of the peripheral region.

8. The display device according to claim 1, wherein the metal electrode layer includes:
a metal reflective film configured to reflect the light of the organic EL element; and
a peripheral electrode that avoids at least the part of the overlapping region.

9. The display device according to claim 8, wherein
the peripheral electrode is a metal film, and
the metal film is closest to the color filter layer.

10. The display device according to claim 8, wherein
the organic EL element includes a transparent common electrode,
the transparent common electrode is on a side of the opposing surface of the element substrate, and
the peripheral electrode is electrically connected to the transparent common electrode.

11. The display device according to claim 10, wherein the transparent common electrode is on the peripheral electrode.

12. The display device according to claim 10, wherein
the peripheral electrode includes a plurality of partial electrodes,
a first partial electrode of the plurality of partial electrodes is spaced apart from a second partial electrode of the plurality of partial electrodes, and
the transparent common electrode is disposed on the plurality of partial electrodes.

13. The display device according to claim 10, wherein
the element substrate further includes a protective film,
the protective film covers the transparent common electrode,
the opposing surface is a surface of the protective film, and
the surface of the protective film faces the transparent substrate.

14. The display device according to claim 10, wherein
the organic EL element further includes;
    a pixel electrode on a side of the transparent common electrode,
wherein the side of the transparent common electrode is opposite to the opposing surface; and
    an organic light emitting layer between the transparent common electrode and the pixel electrode,
the organic light emitting layer is configured to generate the light, and
the metal reflective film is further configured to reflect the generated light to the opposing surface.

15. The display device according to claim 14, wherein the metal reflective film is the pixel electrode.

16. An electronic apparatus, comprising:
a display device that includes:
    a transparent substrate;
    an element substrate that includes:
        an opposing surface that faces the transparent substrate, wherein
            the opposing surface includes a display region and a peripheral region,
            the peripheral region surrounds the display region, and
            the peripheral region includes a bonding region;
        an organic electroluminescent (EL) element configured to emit light from the display region of the opposing surface; and
        an overlapping region that overlaps the bonding region when viewed from the transparent substrate;
    a color filter layer on the opposing surface, wherein
        the color filter layer includes:
            a first color filter in the display region; and
            a second color filter in the peripheral region, and
        the second color filter avoids the bonding region;
    a metal electrode layer on the element substrate, wherein the metal electrode layer avoids at least a part of the overlapping region; and
    a transparent adhesive layer that bonds the transparent substrate to the element substrate via the bonding region; and
a drive circuit configured to drive the display device.

17. A display device, comprising:
a transparent substrate;
an element substrate that includes:
    an opposing surface that faces the transparent substrate, wherein
        the opposing surface includes a display region and a peripheral region,
        the peripheral region surrounds the display region, and
        the peripheral region includes a bonding region;
    an organic electroluminescent (EL) element configured to emit light from the display region of the opposing surface; and
    an overlapping region that overlaps with the bonding region when viewed from the transparent substrate;
a color filter layer on the opposing surface, wherein the color filter layer avoids the bonding region;
a metal electrode layer on the element substrate, wherein the metal electrode layer includes:
    a metal reflective film configured to reflect the light of the organic EL element; and
    a peripheral electrode that avoids at least a part of the overlapping region; and
a transparent adhesive layer that bonds the transparent substrate to the element substrate via the bonding region.

* * * * *